United States Patent [19]

Kern

[11] 3,755,720

[45] Aug. 28, 1973

[54] GLASS ENCAPSULATED SEMICONDUCTOR DEVICE

[75] Inventor: Werner Kern, Belle Mead, N.J.

[73] Assignee: RCA Corporation, New York, N.Y.

[22] Filed: Sept. 25, 1972

[21] Appl. No.: 292,091

[52] U.S. Cl. ..... 317/234 R, 317/234 F, 317/234 G, 106/39, 106/52, 117/215

[51] Int. Cl. ..... H01l 3/00, H01l 5/00

[58] Field of Search ..... 317/234, 3, 3.1, 317/4; 106/39, 52; 117/215

[56] References Cited

UNITED STATES PATENTS

| | | | |
|---|---|---|---|
| 2,920,971 | 1/1960 | Stookey | 317/234 F |
| 2,971,853 | 2/1961 | Stookey | 317/234 F |
| 3,247,428 | 4/1966 | Perri et al. | 317/234 F |
| 3,264,712 | 8/1966 | Hayashi et al. | 317/234 F |
| 3,282,711 | 11/1966 | Lin | 317/234 F |
| 3,300,339 | 1/1967 | Perri et al. | 117/215 |
| 3,319,311 | 5/1967 | Mutter | 317/234 F |
| 3,392,312 | 7/1968 | Carman | 317/234 |
| 3,440,496 | 4/1969 | Saia et al. | 317/234 |
| 3,505,571 | 4/1970 | DeVolder | 317/234 |

*Primary Examiner*—John W. Huckert
*Assistant Examiner*—Andrew J. James
*Attorney*—Glenn H. Bruestle and William S. Hill

[57] ABSTRACT

Glass encapsulated semiconductor device in which the glass has the basic composition PbO, 70–80 wt.%; ZnO, 5–15 wt.%; and $B_2O_3$, 7–15 wt.%.

7 Claims, 2 Drawing Figures

PATENTED AUG 28 1973 3,755,720

GLASS ENCAPSULATED SEMICONDUCTOR DEVICE

BACKGROUND

Semiconductor devices are sensitive to moisture and to other agents present in the atmosphere. It has therefore been found necessary to prevent components of the atmosphere from making contact with active surfaces of the devices. In the past, this has been accomplished in a number of ways. One of these is to mount the devices in hermetically sealed cans. Although this technique has successfully kept out atmospheric contaminants, it has introduced greatly increased bulk to individual devices such as transistors. It has also considerably increased cost of manufacture of the devices. And, in the case of monolithic integrated circuits, it has sometimes required such long seals that hermeticity has been hard to guarantee.

In order to achieve decreased cost of manufacture, many devices are now encapsulated in molded plastics. The molded plastic gives the required mechanical protection but it is not a complete protection against penetration of atmospheric moisture and other contaminants. Devices which have no other protection except the plastic encapsulant, eventually slowly deteriorate. Initial passivation of the device with a thin layer of silicon dioxide or silicon nitride gives some initial protection, but this is not sufficient to provide a complete answer to the problem, in many cases.

Consequently, for more complete protection, it has been found necessary to encapsulate the device with a relatively thick layer of some hard, passivating substance, after passivating it with silicon dioxide or silicon nitride, and prior to encapsulating it with some non-hermetic medium. Certain glasses have been found satisfactory for this purpose in the case of silicon semiconductor devices. However, the glasses found suitable for passivating encapsulation of silicon devices are not suitable for germanium or III-V compound devices. The main reason for this difference is that the thermal coefficient of expansion of silicon is much different than those of germanium or the III-V compounds, and glasses, that are a good physical match for silicon, crack, if used with the latter materials, when the temperature is raised or lowered.

Compatible thermal coefficient of expansion with regard to the entire device structure, is only one of several requirements that a glass must have if it is to be satisfactorily used as a passivation encapsulant for a device made of a particular semiconductor material. The glass must not supply any impurities that would harm the electrical properties of the device. In fact, preferably it should be capable of gettering any unwanted impurities that may diffuse to the surface of the device as it is being processed. Also, a suitable encapsulation glass preferably has a relatively low fusing temperature so that there is less likelihood of device characteristics being changed by temperature during processing.

The present invention is based on the discovery that a certain group of zinc oxide-modified lead borate glasses has suitable thermal coefficients of expansion, fusing temperature and gettering properties to be used as passivation encapsulants for semiconductor devices made of germanium or the III-V compounds.

THE DRAWING

FIG. 1 is a cross section view of one embodiment of a device in accordance with the invention; and FIG. 2 is a cross section view of a second embodiment of a device in accordance with the invention.

DESCRIPTION OF PREFERRED EMBODIMENTS

Figure 1:
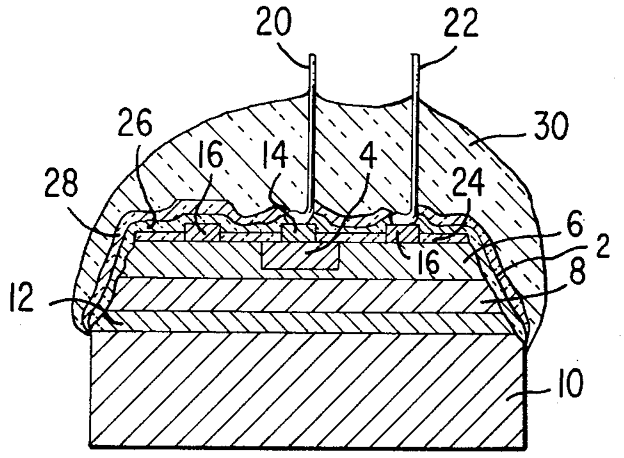

Although the encapsulated device of the present invention may be any type of semiconductor device, as one example (FIG. 1) it may be an NPN bipolar transistor 2 in which the semiconductor body is gallium arsenide. The transistor has an N type emitter region 4, a P type base region 6 and an N type collector region 8. The collector region 8, which has a contact layer (not shown) of tin and nickel, is adhered to a header 10 which may be of copper with a brazed beryllia insert, (not shown) with a mounting paste layer 12 composed of gold, palladium, glass frit and an organic binder. The emitter region 4 is provided with an emitter contact metallization layer 14 and the base region is provided with an annular shaped base contact metallization layer 16 both of which may be composed of a tin (1%)-silver composition.

A gold wire lead 20 is thermocompression-bonded to the emitter contact layer 14 and a similar lead 22 is similarly bonded to the base contact layer 16.

A thin passivation layer of silicon dioxide ($SiO_2$) 24, several thousand Angstroms thick, covers the top surface of the emitter region 4 and the base region 6. Over the oxide layer 24 is a thin layer 26 of silicon nitride ($Si_3N_4$) which serves as an impurity barrier. Typically, this layer may be about 1,000 Angstroms thick. On top of the nitride layer 26 is another thin layer 28 of silicon dioxide which functions as a medium for improving the adherence of a glass encapsulation layer 30 covering at least the entire top surface of the device. The thickness of this layer should be several thousand Angstroms.

The silicon dioxide layers 24 and 28 may be deposited by any conventional method such as reaction between silane and oxygen at 325°–475°C.

The silicon nitride layer 26 may be about 500–1,500A. thick and it may be deposited by RF sputtering from a silicon nitride electrode. Although silicon nitride is a preferred barrier against diffusion of impurity ions that may be present in the glass layer 30, it is possible to substitute, less effectively, a layer of silicon dioxide several thousand Angstroms thick.

The thick, sealing glass layer 30 should have a relatively low softening temperature, (i.e., preferably of the order of 425°C) with a range of about 375°–475°C (within 5 minutes), have a high density and have a coefficient of thermal expansion not too much different from that of the semiconductor material out of which the device is made. In general, the temperature coefficient of expansion range may be about 80–100 × $10^{-7}$ cm/cm °C (between 0°C and 300°C). Since most glass compositions of low softening temperature and high density generally have very high coefficients of thermal expansion, the choice of suitable glasses is very restricted. In accordance with the present invention, the glass layer 30 is made of compositions comprising lead oxide (PbO), zinc oxide (ZnO) and boron oxide ($B_2O_3$). Thickness may range widely from several micrometers to several mils. The composition ranges are as follows:

wt.% preferred

| | wt.% | example |
|---|---|---|
| Lead oxide (PbO) | 70–80 | 75.5 |
| Zinc oxide (ZnO) | 5–15 | 10.5 |
| Boric oxide ($B_2O_3$) | 7–15 | 10.0 |

The total wt.% of these three ingredients may range from 82–100% of the total compositions.

In addition to the three major ingredients listed above, the compositions may also contain the following minor components:

| | wt.% | wt.% preferred example |
|---|---|---|
| Silicon dioxide ($SiO_2$) | 0–8 | 2.5 |
| Aluminum oxide ($Al_2O_3$) | 0–4 | 1.0 |
| Lithium oxide ($Li_2O$) | 0–2 | 0.5 |

The total wt.% of these minor ingredients in the compositions may be 0–14. The minor ingredients are desirable to lower the temperature coefficient of expansion and to increase the chemical resistance of the glass.

The glasses can be prepared by thoroughly mixing the powdered ingredients together and melting the composition in a platinum crucible. After the glass is prepared, it may be powdered and mixed with pure isoamyl alcohol or amylacetate to form a mixture of suitable viscosity, which may range from a thin suspension to a thick slurry. Nitrocellulose dissolved in amylacetate may also be included in the slurry to improve adherence of the glass particles.

For coating small areas, where the layer is relatively thick, heavy suspension of paste-like consistency are applied, using a micro-spatula or an eye dropper, under a microscope. If thin layers are desired, sedimentation techniques may be employed.

After a suitable quantity of suspension has been applied to a device, the solvent is allowed to evaporate slowly in room air. If nitrocellulose has been included in the composition, a combustion treatment in air or oxygen is also necessary.

The device is then given a bake-out treatment at a temperature below the sintering temperature of the glass, in vacuum or a purified neutral or oxidizing gas. In one example, the bake-out was for 5 minutes at 350°C in flowing, dry air.

The composition is then fused into clear glass by heating for 5 minutes at 425°C in dry air. Devitrifying type glasses can also be used and, if used, devitrification can be attained by additional heating for 60 minutes at 450°C in air. The glass is annealed by withdrawing the device slowly from the furnace.

Figure 2:
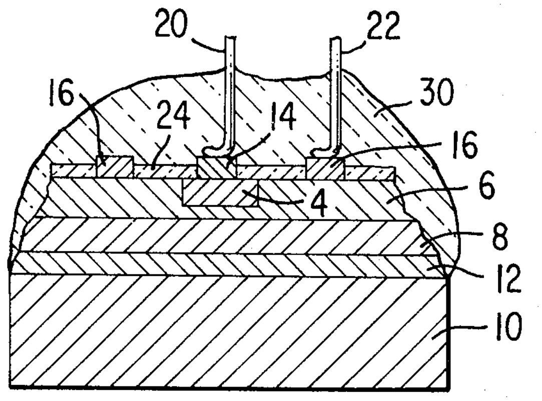

Although the device of FIG. 1, which includes a silicon nitride barrier layer, is preferred, it is sometimes possible to omit this layer and apply the glass encapsulation layer 30 directly over the initial passivation layer 24 of silicon dioxide (FIG. 2). It has been found that, in this type of construction, the glass layer 30, while in the softened state, functions as an impurity-gettering medium. Some transistors which exhibited low collector-base breakdown voltages and high moisture sensitivity prior to encapsulation, had their collector-base breakdown voltages significantly raised and their moisture-sensitivity greatly reduced after application of the glass encapsulation layer described above, directly on the initial silicon dioxide layer 24, including the described heat treatment for 5 minutes at 425°C in dry air. On the other hand, similar treatment of devices which were initially satisfactory prior to glassing did not have their electrical characteristics further improved by the direct glassing treatment but the glassing treatment successfully stabilized them.

I claim:

1. An encapsulated semiconductor device comprising a body of semiconductor material having a relatively high thermal coefficient of expansion, a thin layer of a passivating material on at least a portion of said body, and a relatively thick layer of glass encapsulating said device, said glass having the following composition, with the proportion of the components being chosen to add up to a total of 100 wt.% and the total wt.% of the first three ingredients being within the range of 82–100:

| | | wt.% |
|---|---|---|
| Lead oxide | PbO | 70–80 |
| Zinc oxide | ZnO | 5–15 |
| Boric oxide | $B_2O_3$ | 7–15 |
| Silicon dioxide | $SiO_2$ | 0–8 |
| Aluminum oxide | $Al_2O_3$ | 0–4 |
| Lithium oxide | $Li_2O$ | 0–2 |

2. A device according to claim 1 in which said passivating material includes a layer of silicon nitride.

3. A device according to claim 1 in which said passivating material is silicon dioxide.

4. A device according to claim 1 in which said semiconductor material comprises at least one III-V compound.

5. An encapsulated semiconductor device comprising a body of semiconductor material having a relatively high thermal coefficient of expansion, electrode leads attached to said body, and a relatively thick layer of glass encapsulating said device, said glass having the following composition, with the total wt.% of the first three ingredients being within the range of 82–100 and the total wt.% of the second three ingredients being within the range of 0–14:

| | wt.% |
|---|---|
| PbO | 70–80 |
| ZnO | 5–15 |
| $B_2O_3$ | 7–15 |
| $SiO_2$ | 0–8 |
| $Al_2O_3$ | 0–4 |
| $Li_2O$ | 0–2 |
| total — | 100 |

6. A device according to claim 5 in which said body has at least one pn junction extending to a surface thereof.

7. An encapsulated semiconductor device comprising a body of semiconductor material having a relatively high temperature coefficient of expansion, electrode leads attached to said body, and a relatively thick layer of glass encapsulating said device, said glass having the composition:

| | wt.% |
|---|---|
| PbO | 75.5 |
| ZnO | 10.5 |
| $B_2O_3$ | 10.0 |
| $SiO_2$ | 2.5 |
| $Al_2O_3$ | 1.0 |
| $Li_2O$ | 0.5 |

* * * * *